United States Patent [19]

McLean et al.

[11] Patent Number: 4,475,212

[45] Date of Patent: Oct. 2, 1984

[54] FREQUENCY-INDEPENDENT, SELF-CLOCKING ENCODING TECHNIQUE AND APPARATUS FOR DIGITAL COMMUNICATIONS

[75] Inventors: Peter T. McLean; O. Winston Sergeant, both of Colorado Springs, Colo.

[73] Assignee: Digital Equipment Corporation, Maynard, Mass.

[21] Appl. No.: 301,193

[22] Filed: Sep. 11, 1981

[51] Int. Cl.³ .......................................... H04L 25/49
[52] U.S. Cl. ........................................ 375/17; 371/56; 375/19; 455/608
[58] Field of Search ............... 375/17, 19, 20, 37, 375/55, 60, 110; 332/11 R; 371/56; 370/43, 44; 360/40, 41, 44, 45, 48, 51; 455/608

[56] References Cited

U.S. PATENT DOCUMENTS

| Re. 31,311 | 7/1983 | Miller | 360/40 |
|---|---|---|---|
| 3,243,580 | 3/1966 | Welsh | 360/42 |
| 3,276,033 | 9/1966 | Cogar et al. | 360/40 |
| 3,331,079 | 7/1967 | Reader | 360/40 |
| 3,840,892 | 10/1974 | Hayashi | 360/45 |
| 3,863,025 | 1/1975 | Gonsewski et al. | 375/55 |
| 4,027,152 | 5/1977 | Brown et al. | 455/608 |
| 4,084,069 | 4/1978 | Looschen | 375/17 |
| 4,167,760 | 9/1979 | Decker | 360/40 |
| 4,255,742 | 3/1981 | Gable et al. | 375/19 |
| 4,282,601 | 8/1981 | Flora | 375/17 |
| 4,317,211 | 2/1982 | Quesnell | 375/87 |

OTHER PUBLICATIONS

Logic Diagram-Transceiver, Model T550 (Network Systems Corporation)-2 pages.
J. Norton, "Drop Your Costs, But Not Your Bits With a Manchester-data Decoder," Electronic Design 15, Jul. 19, 1979 at 110-116.
Taschenbuch Der Nachrichten-Verarbeitung Unter Mitwirkung Zahlreicher Fachleute Herausgegeben Von Dr. Ing K. Steinbuch Springer-Verlag Berlin/-Gottingen/Heidelberg, 1962.

Primary Examiner—Benedict V. Safourek
Attorney, Agent, or Firm—Cesari and McKenna

[57] ABSTRACT

A self-clocking encoding technique for synchronous transmission of digital signals, and apparatus therefor. In an exemplary embodiment, the encoding technique utilizes relatively positive and negative pulses of fixed, predetermined duration. For electrical pulses, the point of reference is preferably a zero baseline. At the leading edge $LE_i$ of the $i^{th}$ bit cell, the value of the $i^{th}$ bit is encoded as a positive pulse in the case of a logical "1" or a negative pulse in the case of a logical "0". Further, the next subsequent (i.e., $(i+1)^{th}$ bit has the same value, a pulse (e.g., 82D) of the opposite polarity is injected into the $i^{th}$ bit cell after the leading edge pulse. Thus, positive and negative pulses alternate and the information content of the encoded signal has no d.c. component; this facilitates a.c. coupling. Further, the encoding technique is bit-rate (i.e., frequency-) independent and usable over a wide range of bit transfer rates. The receiver can synchronously decode the signal if it knows the pulse width; it need not know the sender's transmission rate and indeed, bit transmission rate may even change from one bit cell to the next.

For a fiber optic implementation, a non-zero baseline is used. The optical zero output level replaces the electrical negative pulse level, the half-maximum optical output level replaces the electrical zero level and the maximum optical output level replaces the electrical positive pulse.

14 Claims, 9 Drawing Figures

| ADDRESS INPUTS | | OUTPUTS | |
|---|---|---|---|
| B | A | Y+ | Y− |
| ∅ | ∅ | L | L |
| L | L | $X_1$ | $X_3$ |
| L | H | D | $X_3$ |
| H | L | $X_2$ | D |
| H | H | $X_2$ | $X_4$ |

∅ = DON'T CARE
D = NOT CONNECTED

Fig. 5

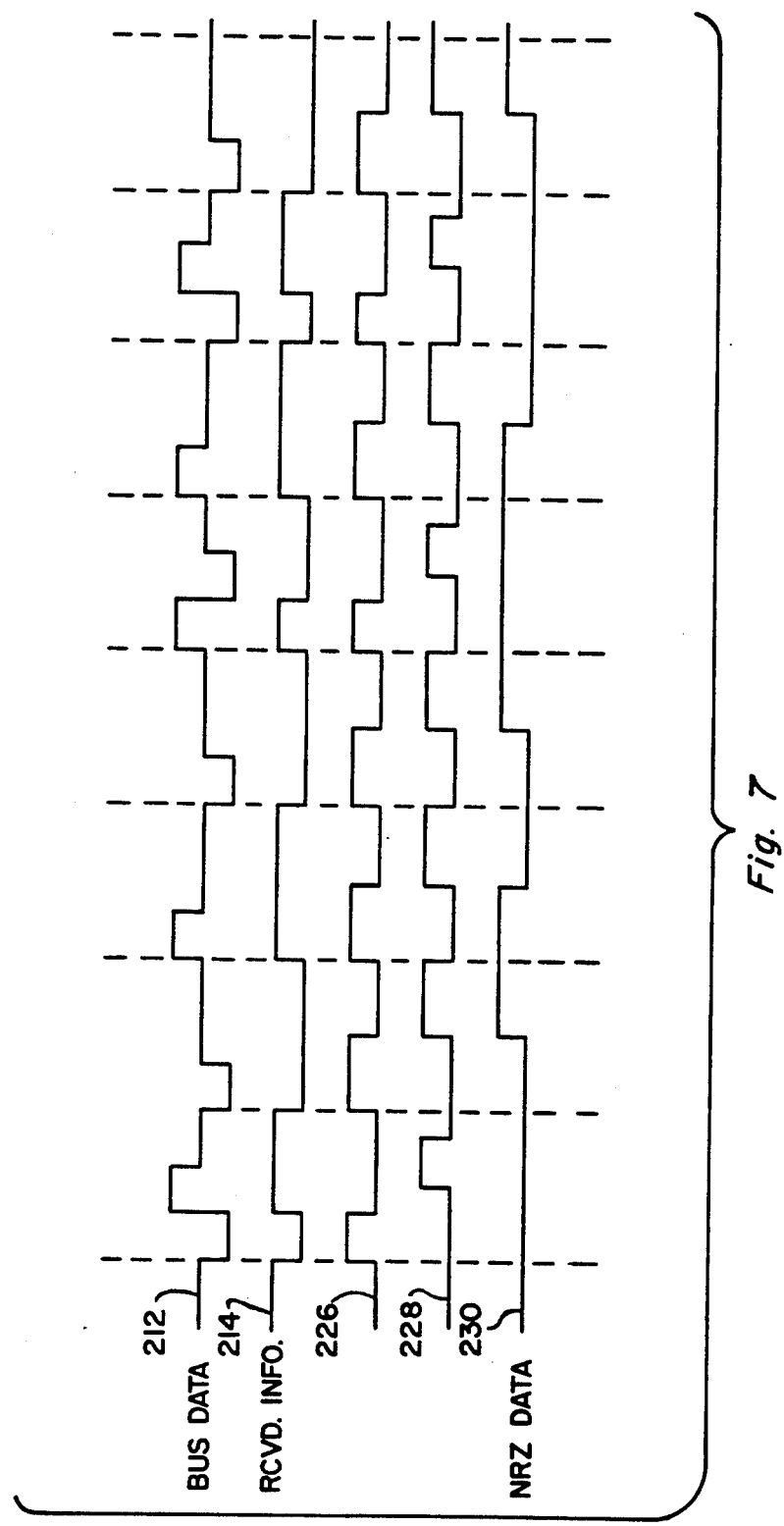

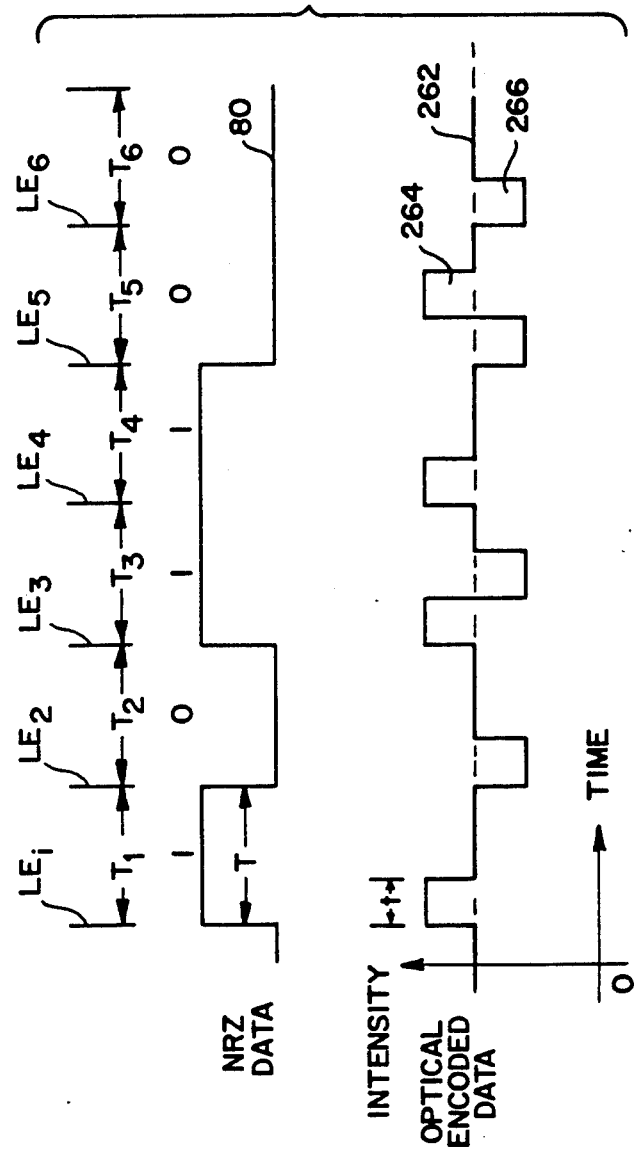

FREQUENCY-INDEPENDENT, SELF-CLOCKING ENCODING TECHNIQUE AND APPARATUS FOR DIGITAL COMMUNICATIONS

FIELD OF THE INVENTION

This invention generally relates to digital communications and, more particularly to an encoding technique for transmitting digital information between different devices in data processing systems, such as controllers and drives.

BACKGROUND OF THE INVENTION

Digital systems, such as data processing systems, frequently require that different devices in the systems communicate with one another over interconnecting cables or other links, such as fiber-optic channels. For example, a secondary storage facility used in a data processing system generally comprises a controller and one or more drives connected to the controller. These different devices must communicate with each other.

Typical drives include, but are not limited to, direct access memory devices, such as magnetic disk, tape or drum memories, and newer magnetic bubble memories. These secondary storage facilities, especially facilities using magnetic disk memory devices as the drives, have become very sophisticated in recent years. Unfortunately, in efforts to increase performance, interconnections between controllers and drives (including communications codes) have increased in complexity and cost.

Part of the cost and complexity is a result of the fact that different drives operate at different data (i.e., bit) transfer rates. For a controller to communicate with a drive, it must be able to receive (and send) information at the drive's transfer rate. And if a drive is disconnected and replaced by one designed for a different transfer rate, the controller must accommodate the new drive, also. Moreover, if a controller is connected to multiple drives, it must be able to operate, in turn, at the appropriate rate for each.

One approach to this problem is to use in the controller a wide-band phase-locking loop (PLL). Such PLL's, however, are complicated and expensive, and they require time to home in on frequency (and phase) the received signal.

Another approach has been for the drive to send to the controller a separate clocking signal, which the controller can then use both for decoding data signals from the drive and for clocking the controller's transmissions to the drive. This approach, however, requires that the controller-drive interconnection include a separate channel dedicated to the clocking signal.

Further, as data processing systems have become more complex and the topology of data processing systems has become more elaborate, so-called "ground loop" problems have become significant and troublesome. There are two primary causes of ground loop currents. The first is that electrical fields from power cables and power distribution lines induce a.c. potentials in the cables which run between different units. The second is that two or more devices fed from a common a.c. power source will be out of phase with each other due to different phase lags in their power distribution. Thus, their "grounds" are not at precisely the same potential. The resulting currents between devices, along the ground conductors of the interconnection cables, can interfere with and degrade the operation of the line drivers and receivers at the cable terminations, adversely affecting communications over the cables. Further, such ground currents can cause or allow electromagnetic energy to radiate from the cable. That radiation may violate government regulations or industry standards, and it may interfere with the operation of other equipment.

It also an object of the invention that such encoding technique permit a.c. coupling of signals transmitted between transmitting and receiving devices.

Therefore, it is an object of this invention to provide a digital encoding technique and apparatus therefor, adapted for use in a secondary storage facility (and, more particularly, in an interconnection between controllers and drives in such a facility), which is inexpensive and simplifies the interconnection between drives and controllers.

Still another object of this invention is to provide an encoding technique which permits self-clocking, rapidly synchronizing communications between devices at any rate within a broad range of rates, without need for the transmission of a separate clocking signal and without prior knowledge of the bit rate of the transmitting device.

A further object of the invention is to provide an encoding technique which is compatible with both electrical and fiber-optic implementations.

Another object of this invention is to provide an encoding technique and device interconnection which eliminates or at least substantially reduces ground loop problems when the interconnection is electrical.

It is also an object of the invention that such encoding technique permit a.c. coupling of signals transmitted between transmitting and receiving devices.

Still another object of this invention is to provide an encoding technique and apparatus which is capable of permitting communications between a controller and drive at high bit transfer rates.

SUMMARY OF THE INVENTION

In accordance with this invention, the foregoing objects are achieved primarily by using special signal handling techniques. All information is transmitted between controller and drive using a self-clocking coding scheme which eliminates the need for transmission of a separate clocking signal. The encoding scheme is, up to some limit, frequency-independent; that is, it is operable over a wide frequency range, or bit rate, and the receiving device does not have to know the bit transfer rate of the sending device. The encoded signals have no d.c. component and for any transfer rate of practical interest, the a.c. components are all of high frequency. This permits the use of feedback hysteresis at the receiver and facilitates high-pass a.c. coupling of the encoded signals to the cabling. The latter feature eliminates the main path for ground loop currents (which primarily are low-frequency—e.g., 60 Hz—power). It also permits a simple fiber-optic implementation.

According to this encoding method, data bits are communicated over the interconnection cabling via bipolar (i.e., positive and negative) pulses of predetermined, fixed duration. To determine the pulse pattern for a given bit cell, that bit is compared with the next subsequent bit. At the leading edge of the bit cell, a pulse is sent to signal the bit value. A positive pulse indicates a "1"; a negative pulse, a "0". (Of course, the opposite convention also could be used.) If the next (subsequent) bit has the same value, a second pulse also is sent within the bit cell, after the first pulse. This second pulse is given the opposite polarity from the first pulse. Thus, pulse polarities alternate and the average value of the transmitted signal is zero (i.e., it has no d.c. component). The average value also can be non-zero, so long as it is constant, since the average value does not contain any message information.

The encoded signal, it will be seen, is composed of the superposition (or addition) of two pulse streams. The first pulse stream comprises those pulses generated at the leading edge of each bit cell, representing the bit values. The second pulse stream comprises the compensating, opposite polarity pulses injected to force the d.c. component of the encoded signal to zero.

The interval between successive pulses in the first pulse stream is a function solely of the bit transfer rate or, equivalently, the duration of the bit cell. But the receiving device does not have to know the bit transfer rate. So long as the receiver knows the width (i.e., duration) of the pulses, it can detect and separate data and clock. If this pulse width is constant and known, the data rate can vary over a wide range, from near zero to some upper limit (which is determined by pulse width). Theoretically, the maximum transfer rate is reached when the combined widths of a pair of pulses (one of each type) is the same as the duration of a bit cell. In practice, of course, some safety margin must be added.

Due to the alternating pulse polarities, it is easy to detect single pulses which are missing, added (e.g., by noise) or altered. Every bit cell is checked for proper pulse alternation. This is almost like having a parity bit for each transmitted bit, without any additional overhead.

For a fiber-optic implementation, an a.c.-coupled receiver can be used, with a "tri-state" transmitter optical source. In this arrangement, zero output replaces the negative pulse, half-maximum replaces the zero level and maximum optical output replaces the positive electrical pulse.

This invention is pointed out with particularity in the appended claims. The above and further objects and advantages of the invention may be better understood by referring to the following detailed description, which should be read in conjunction with the accompanying drawing.

BRIEF DESCRIPTION OF THE DRAWING

In the drawing,

FIG. 5 is a truth table for the multiplexer 106 of FIG. 3;

FIG. 7 is an illustration of exemplary waveforms associated with the decoder of FIG. 6A; and FIG. 8 is a counterpart illustration to FIG. 1, showing an encoded waveform for optical communication.

DESCRIPTION OF AN ILLUSTRATIVE EMBODIMENT

A self-clocking encoding technique is described. By using a self-clocking code, the need to transmit a separate clocking signal is obviated. Referring to a secondary storage facility as an exemplary use, the controller separates the drive's clock from the encoded "clock and data" signal it receives from the drive. It then uses this information to generate the clock used for transmitting to the drive. Signal transmission is thus always at the drive's data transfer rate.

Moreover, because of the way this encoding technique operates, the decoding apparatus automatically tracks variations in data rate. Consequently, a drive using one transfer rate can be disconnected from a cable and a drive using a slower or faster rate may be connected to the same cable, as a replacement, without the need for any alteration or adjustment of the controller. Indeed, it is even possible to interrupt or stop a transmission without disturbing the encoding and decoding schemes. When communication resumes, the system simply picks up where it left off.

Figure 1:
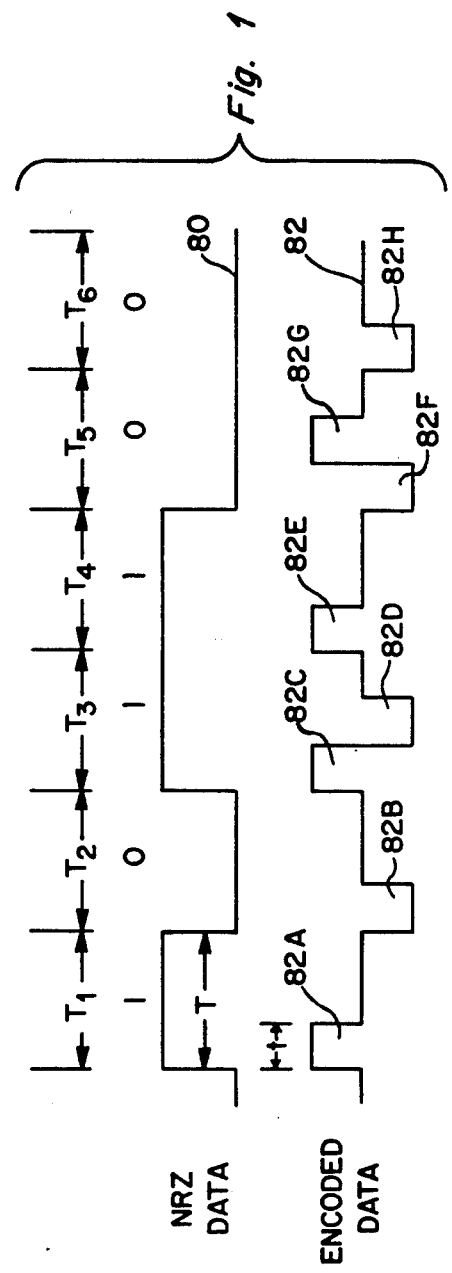
FIG. 1 is a diagramatic illustration of an unencoded waveform and its encoded counterpart according to the present invention.
Figure 2:
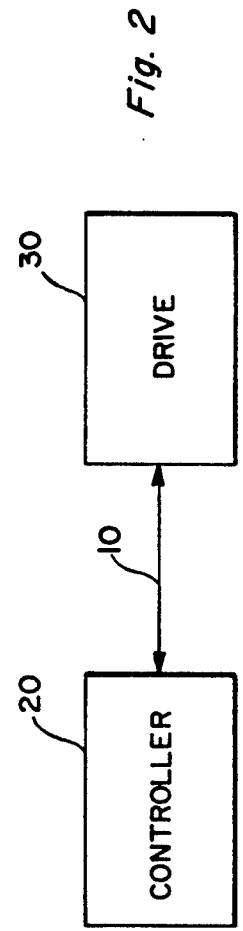
FIG. 2 is a block diagram illustrating a secondary storage system in which the present invention is useful.

FIG. 1 illustrates the waveform generated by the encoding scheme of the present invention to transmit data in the system of FIG. 2 over cable 10, between a controller 20 and a drive 30. Assume that waveform 80 represents NRZ data to be sent from the drive to the controller. Six bits are to be sent, representing the binary pattern 101100. Each bit is present for a time T, the bit cell time. The symbol $T_i$ represents the duration of the $i^{th}$ bit cell. The resulting encoded data is shown in waveform 82, which represents the actual signal which would be transmitted onto the cable 10.

The rule for encoding is quite simple. A pulse is transmitted in waveform 82 at the leading edge ("LE") of each bit cell. That pulse may have either a positive polarity (steps 41 and 42A) or a negative polarity (steps 41 and 42B), the former for a "1" and the latter for a "0," according to the value of the bit being encoded. In order to satisfy the objective of eliminating any d.c. component, however, pulse polarities must alternate. Therefore, If two adjacent bit cells are both 0 or both 1, an additional pulse is injected into the first of the two cells of the pair; the injected pulse is given the polarity opposite that of the first pulse in the cell. (Steps 43 and 44) further constraint related to the elimination of the d.c. component is that the positive and negative pulses must have equal, but opposite, average values; the easiest way to accomplish this is with equal but opposite amplitudes and equal durations. When that is done, the encoded signal has no d.c. component and the waveform 82 may be a.c. coupled onto the cable 10.

It will be apparent, of course, that the encoded signal, although transmitted in "real time," must be slightly delayed from the raw data signal, in order to permit a "look ahead" comparison with the next cell.

The example of FIG. 1 may now be explained in further detail with reference to these principles. The first bit cell, occurring in time interval $T_1$, contains a 1, which is encoded into a positive pulse 82A. Looking ahead to the next bit, provided in time $T_2$, we see that it is a 0. Since that is the opposite of the first bit, no "polarity reversal" pulse need be injected into cell 1. The second bit is transmitted at the leading edge of the second cell (LE2), as a negative pulse 82B. Looking ahead, the third bit, in interval $T_3$, is a 1, which is of opposite polarity from the second bit. Therefore, no "polarity reversal" pulse need be injected into cell 2. A positive pulse 82C is transmitted as the encoded version of the bit in cell 3, since it is a 1. Cell 4, however, also contains a 1, which is of the same sense as the bit in cell 3. According to the rules above-stated, a negative "polarity reversal" pulse 82D is therefore injected into cell 3, following pulse 82C.

As indicated in FIG. 1, the leading edge of pulse 82D is coincident with the trailing edge of pulse 82C; however, the two pulses may be slightly separated if the bit cell is wide enough.

Bit 5, in interval $T_5$, is of the opposite sense as bit 4, so the only pulse in interval $T_4$ is pulse 82E, a positive pulse indicating that the bit value is "1." The 0 value of bit 5 is encoded as negative pulse 82F in interval $T_5$. Since bit 6 is also a 0, however, a compensating positive pulse 82G is injected in cell 5 for polarity reversal. A negative pulse 82H is generated at the leading edge of cell 6, to correspond to the 0 value of bit 6.

It will thus be seen that cell times $T_i$ must be long enough to permit at least a pair of pulses to be transmitted. That is, $T_i$ must be at least 2 t seconds long, where t represents the maximum duration of each of the positive and negative pulses.

Figure 3:
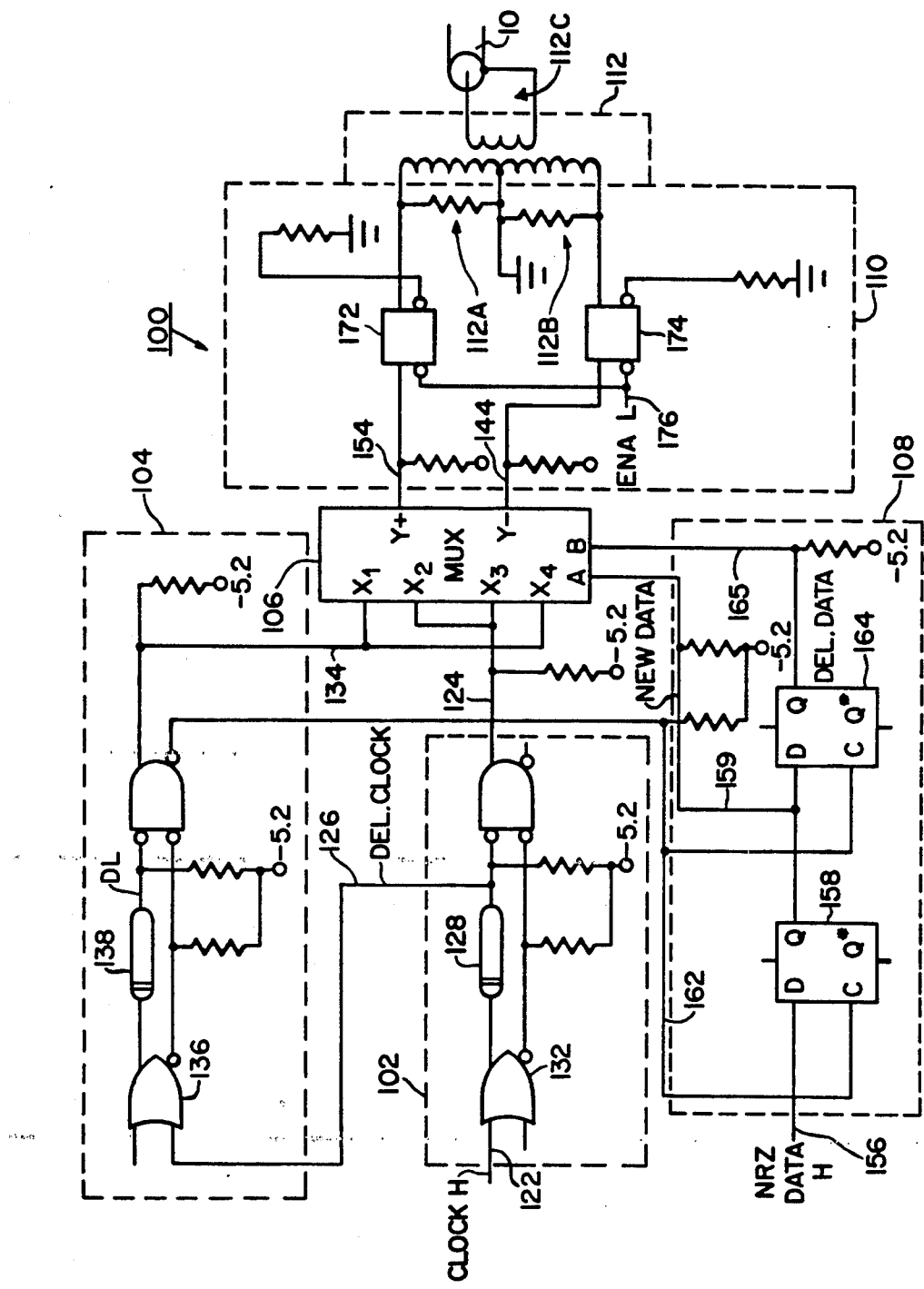
FIG. 3 is a schematic circuit diagram of apparatus for encoding information in accordance with this invention.
Figure 4:
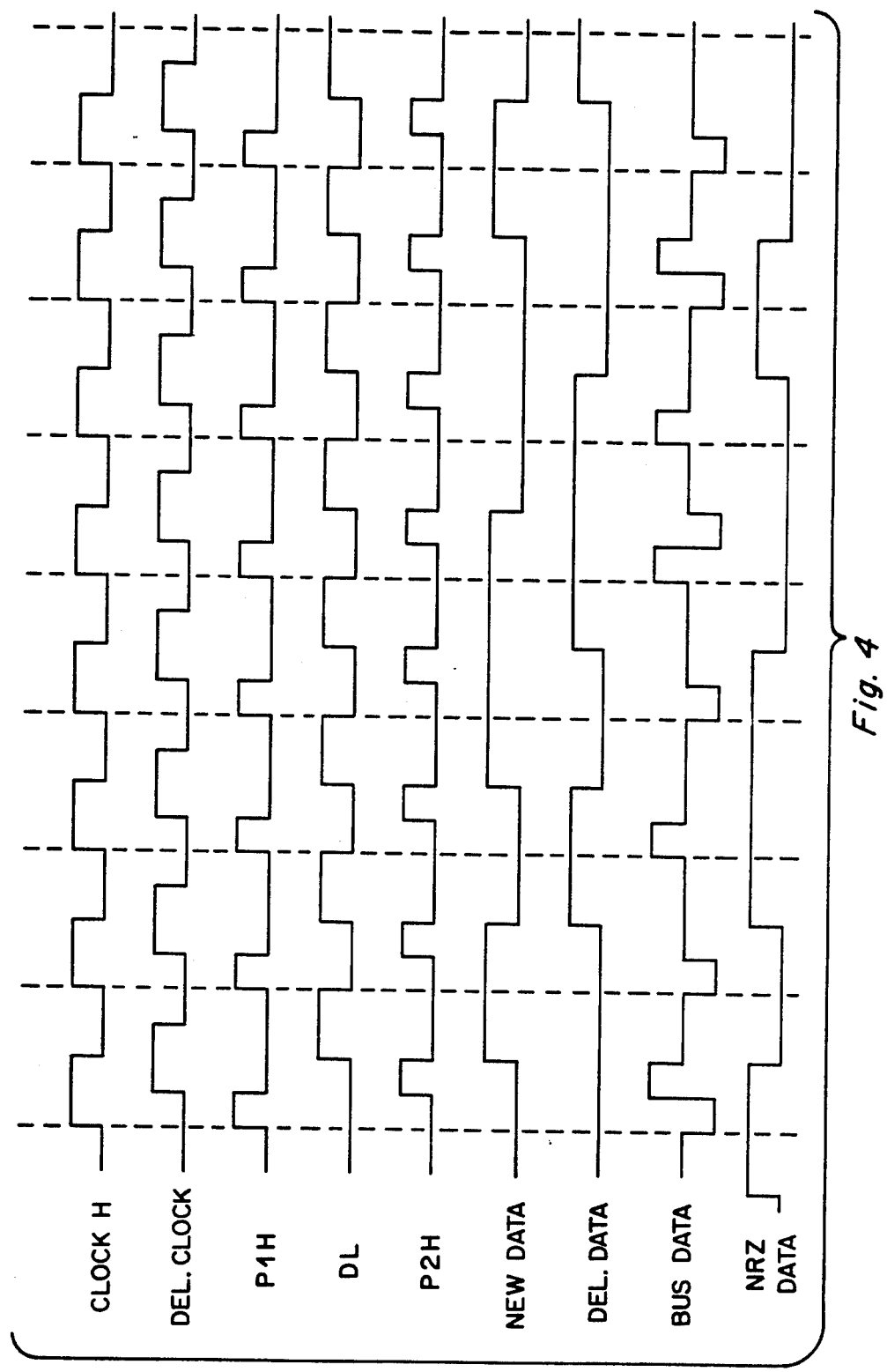
FIG. 4 is an illustration of an exemplary waveform associated with the encoder of FIG. 3.

A suitable encoder/cable driver circuit is shown in FIG. 3. It receives as inputs an NRZ data signal and a synchronous clock, and provides as its output an ENCODED DATA signal which contains both data and clock information. Waveforms associated with this circuit are shown in FIG. 4. Basically, the encoder/driver 100 comprises a pair of edge-triggered pulse generators 102 and 104, a multiplexer 106, a multiplexer control circuit 108, a pulse transformer driver network 110 and a pulse transformer 112.

Pulse generator 102 receives a CLOCK signal on line 122 and provides two outputs, a P1H signal on line 124 (to inputs $X_2$ and $X_3$ of multiplexer 106) and a DEL CLOCK signal on line 126 (to second pulse generator 104). At each positive-going (i.e., leading) edge in the CLOCK signal on line 122, pulse generator 102 provides a positive-going pulse in the P1H signal on line 124.

The duration of the P1H pulse is controlled principally by a delay line 128 and may, for example, be approximately 14 nanoseconds to support a bit transmission rate of up to about 25 Mb/s, with a good safety margin. The delay provided by delay line 128 establishes the duration of the P1H pulses. Thus, the DEL CLOCK signal on line 126 represents the CLOCK signal delayed by the P1H pulse width. Accordingly, the pulse generator 104 provides positive-going pulses on line 134, designated the P2H signal. The leading edges of the P2H pulses are coincident with the falling edges of the P1H pulses on line 124.

When delay lines 128 and 138 are matched, the P1H and P2H pulses will have equal duration. To facilitate fabrication and matching, delay lines 128 and 138 may be replaced with RC networks. Present manufacturing techniques permit the resistors in such networks to be very finely adjusted, so that the delays and, hence, the durations of the P1H and P2H pulses, can be made very nearly equal.

The P1H and P2H signals actuate the pulse transformer driving circuit 110 to drive appropriately timed positive and negative pulses on to cable 20. Mux 106 determines when each of the P1H and P2H signals is allowed to drive a pulse onto the cable, and selects the actual polarity of each pulse.

A pulse is allowed to appear on line 154, at the Y+ output of mux 106, when a positive pulse should drive the cable. A pulse on line 154 turns on an open collector driver 172, pulling current through top half 112A of the primary winding of transformer 112. In turn, this puts a positive pulse on the cable 10. Conversely, to drive a negative pulse onto the cable, a pulse is allowed to appear on line 144, at the Y— output of mux 106. This turns on an open collector driver 174, pulling current through bottom half 112B of the primary winding of transformer 112 and inducing a negative pulse on cable 10.

The operation of multiplexer 106 is controlled by multiplexer control circuit 108. The mux control circuit 108, in turn, responds to the NRZ data to be transmitted and determines when P1H and P2H pulses appear at each of the mux outputs.

Multiplexer 106 more or less comprises a pair of single-pole, double-throw switches. Its poles are its Y+ and Y— outputs. The Y+ output may be thrown to input $X_1$ or input $X_2$; the Y— output may be thrown to input $X_3$ or input $X_4$. The states of the mux switches are determined by the signals provided on lines 159 and 165 to the A and B control inputs of the multiplexer, respectively. Thus, P1H and P2H pulses may appear at either mux output. The truth table in FIG. 5 summarizes the operation of mux 106 for a specific implementation utilizing an ECL type 10174 multiplexer. (Likewise, the other digital components may be compatible ECL components.)

The signal to be encoded, labelled NRZ DATA, is supplied on line 156 to the D input of a first D-type flip-flop 158. Flip-flop 158 is clocked by the complement of the P2H signal, which is supplied by pulse generator 104 via line 162. The Q output of flip-flop 158 is supplied to the D input of a second D-type flip-flop 164 (which is similarly clocked) and to a first control input, A, of multiplexer 106. The Q output of flip-flop 164 is supplied to the second control input, B, of multiplexer 106.

The signal supplied by flip-flop 158 to control input A of multiplexer 106 shall be referred to herein as the NEW DATA signal. The output of flip-flop 164 which is supplied to mux control input B shall be referred to as the DEL DATA signal. The NEW DATA signal corresponds to the NRZ DATA signal delayed by one clock period, while the DEL DATA signal corresponds to the NEW DATA signal delayed by one more clock period.

By way of example, assume that for a particular bit cell of interest the initial pulse is to be of positive polarity. In that case, the P1H pulse for the cell, from line 124, is steered through the multiplexer 106 from the $X_2$ input to the Y+ output, at line 154. If there is then to be a negative pulse (because the next bit also is a "1"), the following P2H pulse will be gated from line 134 (i.e., the $X_4$ input), through the multiplexer, and onto line 144 (i.e., the Y— output).

Conversely, if the initial pulse in the bit cell is to be negative, then the P1H pulse on line 124 will be steered through the multiplexer 106 to line 144, the Y— output.

It should thus be clear that the P1H and P2H pulses control only the timing of line driver actuation; each may cause both positive and negative pulses. The polarity of a pulse on the cable 10 is determined by which one of the drivers (172 or 174) was turned on to produce it.

An enable/inhibit signal may be provided via line 176 to both of line drivers 172 and 174, to disable the line drivers and prevent spurious signals from being placed on the cable when data is not being transmitted.

Figures 6A, 6B:
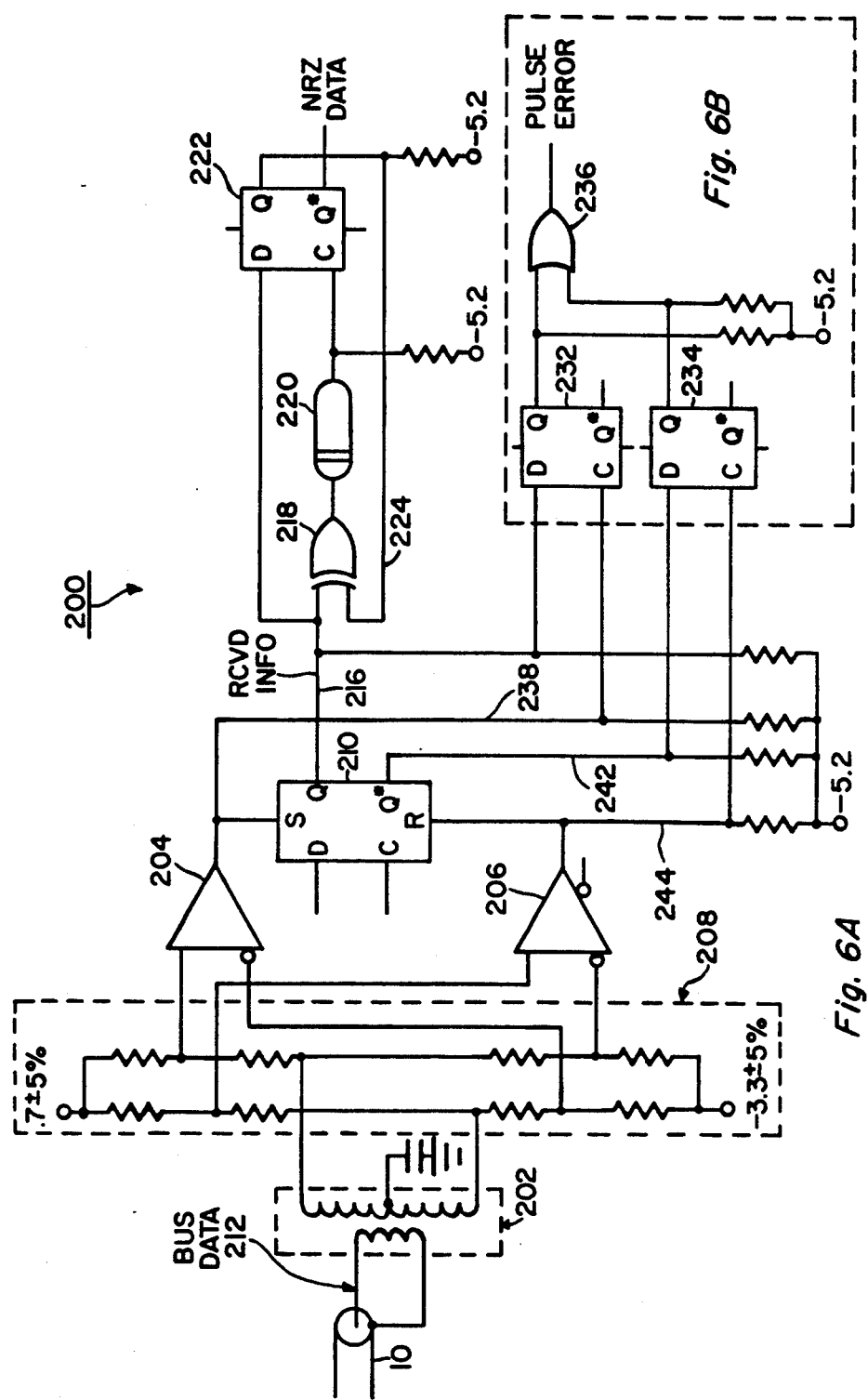
FIG. 6A is a schematic circuit diagram of apparatus for decoding a signal encoded and transmitted in accordance with this invention.
FIG. 6B is a schematic circuit diagram of optional apparatus usable in conjunction with the apparatus of FIG. 6A to detect single-bit transmission errors.

FIGS. 6A and 6B illustrate an exemplary receiver/decoder circuit compatible with the encoder/transmitter of FIG. 3. The basic receiver/decoder is shown in FIG. 6A; FIG. 6B illustrates additional optional circuitry which can detect pulse errors—i.e., the injection of a spurious pulse (e.g., by noise) or the absence of a pulse which should have been present.

Referring now specifically to FIG. 6A, the operation of the basic receiver/decoder circuit 200 will be explained. For this purpose, reference also will be made to FIG. 7, which contains waveforms which may be observed at various points in the circuit of FIG. 6A.

Cable 10 is terminated at receiver/decoder 200 by the primary winding of a pulse transformer 202. The secondary winding of transformer 202 is connected to a pair of line receivers 204 and 206, through a resistive network (indicated generally at 208). Resistive network 208 provides a matching impedance to terminate the cable and sets thresholds for the line receivers. Line receiver 204 detects positive pulses on the cable, while line receiver 206 detects negative pulses. The output of receiver 204 is supplied to the set input (S) of a flip-flop 210, and the output of line receiver 206 is supplied to the reset input (R) of the same flip-flop. Thus, the leading edge of a positive pulse on cable 10 sets flip-flop 210 and the leading edge of a negative pulse on cable 10 resets it. By way of illustration, for the bus data waveform 212 in FIG. 7, this results in the waveform 214 at the Q output of flip-flop 210, on line 216; this is referred to as the RCVD INFO signal.

The Q output of flip-flop 210 is supplied to an NRZ reconstruction network comprised of exclusive-OR gate 218, delay line 220 and D-type flip-flop 222. For decoding the $i^{th}$ bit, exclusive-OR gate 218 receives, on line 216, the waveform of the $i^{th}$ cell, which is also supplied to the D input of D-type flip-flop 222. The Q output of flip-flop 222, representing the value of the $(i-1)^{th}$ bit is supplied as the other input to exclusive-OR gate 218 via line 224. The resulting output of the exclusive-OR gate is shown as waveform 226 in FIG. 7. The output of the exclusive-OR gate 218 is the input to a delay line 220 which provides the same delay as delay lines 128 and 138. The output of delay line 220, shown as waveform 228 in FIG. 7, strobes or clocks flip-flop 222, so that flip-flop 222 samples the RCVD INFO signal during the first pulse of each bit cell; the exclusive-OR gate prevents flip-flop 222 from responding to any subsequent pulses in the bit cell. The Q* output of flip-flop 222 supplies the fully decoded NRZ data indicated in FIG. 7 at waveform 230.

By the addition of the simple circuit shown in FIG. 6B, a single missing or added pulse can be detected. The circuit comprises a pair of D-type flip-flops 232 and 234, and an OR gate 236. Flip-flop 232 detects added pulses, while flip-flop 234 detects missing pulses. The D input of flip-flop 232 is connected to line 216, which carries the RCVD INFO signal, and the clock for that flip-flop is provided by the output of line receiver 204 on line 238. If the Q output of the flip-flop is a 1, an error is indicated.

Similarly, the D input of flip-flop 234 receives the RCVD INFO* signal from the Q* output of flip-flop 210, on line 242. Flip-flop 234 is clocked by the output of line receiver 206 via line 244. Consequently, the Q output of flip-flop 234 indicates missing pulses.

The outputs of flip-flops 232 and 234 are combined by OR gate 236 to signal a pulse error when either flip-flop detects an error. Basically, the circuit in FIG. 6B indicates an error whenever it detects that the polarity of a consecutive pair of the received pulses has not alternated.

The same basic technique can be utilized, of course, for optical communications as well. In that situation, however, d.c. isolation between drive and controller is inherent in the use of an optical channel. Therefore, it is unnecessary to use the d.c. cancelling features of the code. One could, for example, transmit over the cable a signal corresponding to what has been referred to above as the RCVD INFO signal. Or a "d.c." bias could be added, as shown in FIG. 8. That is, a constant light intensity level 262 could be used as a reference, with an increase corresponding to a positive pulse 264 and a decrease corresponding to a negative pulse 266, as explained in the Summary of the Invention section, above.

That is, the pulses need be only relatively positive or relatively negative; and the word "relative" should be understood to be implied above preceding occurrences of "positive" and "negative", as appropriate.

Moreover, while relatively positive and negative electrical or optical pulses are shown or discussed explicitly, they are used only as examples. In general, all that is required is the use of two different types of signals of known duration, and that is all the word "pulses" is intended to indicate.

Having thus described exemplary embodiments of the invention, it will be apparent that various alterations, modifications and improvements will readily occur to those skilled in the art. Such obvious alterations, modifications and improvements, though not expressly described above, are nonetheless intended to be implied and are within the spirit and scope of the invention. Accordingly, the foregoing discussion is intended to be illustrative only, and not limiting; the invention is limited and defined only by the following claims and equivalents thereto.

What is claimed is:

1. A frequency-independent, self-clocking method for communicating a stream of digital information bits from a sending device to a receiving device, the information bits being communicated at a data rate, wherein each bit is provided for an interval termed a "bit cell" ($T_i$), the beginning of each bit cell being termed its leading edge, such method comprising the steps of:

(a) at the leading edge of the $i^{th}$ bit cell ($T_i$), transmitting a pulse of a first type when the $i^{th}$ bit is a 1 and transmitting a pulse of a second type when the $i^{th}$ bit is a 0, the pulses of the first and second type being of the predetermined, fixed duration;

(b) comparing the $i^{th}$ bit with the $(i+1)^{th}$ bit; and (c) transmitting a second pulse during the $i^{th}$ bit cell, after the first pulse has been transmitted in the $i^{th}$ bit cell, the second pulse being transmitted within a predetermined time interval after the leading edge of the $i^{th}$ bit cell, the time interval being fixed and being independent of the data rate, the transmission of a second pulse being responsive to the comparison step indicating that the $(i+1)^{th}$ bit has the same value as the $i^{th}$ bit, the second pulse being of the second type if the $i^{th}$ bit is a 1 and being the first type if the $i^{th}$ bit is a 0, whereby there is provided an encoded bit stream in which clock and data are combined and which can be decoded without knowledge of the frequency or data rate of the bit stream.

2. The method of claim 1 wherein the first type of pulse has a first type of electrical polarity and the second type of pulse has opposite electrical polarity.

3. The method of claim 1 wherein the first type of pulse comprises an optical signal (264) differing in amplitude in a first direction from an average level (262) and the second type of pulse comprises an optical signal (266) differing in amplitude in the opposite direction from the average level (262).

4. The method of any of claims 1-3 wherein the duration of each bit cell is at least as long as the combined duration of two pulses, one of the first type and one of the second type.

5. The method of any of claims 1-3 wherein pulses of the first and second types have equal, but opposite, average amplitude values, whereby the average value of the encoded signal is substantially constant, to facilitate a.c. coupling of the encoded signal between the sending device and the receiving device.

6. A method for communicating binary digital information from a sending device to a receiving device at a data rate, wherein each bit to be communicated is available for an interval termed a "bit cell", the beginning of each bit cell being referred to as its leading edge, such method comprising, at the sending device, the steps of:

(a) at the leading edge of the $i^{th}$ bit cell, transmitting a signal of a first type when the $i^{th}$ bit is a 1 and transmitting a signal of a second type when the $i^{th}$ bit is a 0;

(b) comparing the $i^{th}$ bit with the $(i+1)^{th}$; and (c) a predetermined, fixed duration after the leading edge of the bit cell, changing the transmitted signal from the first type of signal to the second type or vice-versa, responsive to the comparison step indicating that the $(i+1)^{th}$ bit has the same value as the $i^{th}$ bit, and not changing the type of signal transmitted responsive to the comparison step indicating that the $(i+1)^{th}$ bit and the $i^{th}$ bits have different values, said fixed duration being independent of the data rate.

7. The method of claim 6 further including, at the receiving device, the steps of:

responsive to the transmitted signal, generating a received information (RCVD INFO) signal which assumes a first state responsive to reception of a signal of said first type and assumes a second state responsive to reception of a signal of said second type;

sampling the received information signal during the first or second type signal transmitted at the leading edge of each bit cell holding the logical value of the sample unchanged between successive samples (272), whereby such sample corresponds to the NRZ waveform provided to the sending device.

8. Apparatus for encoding an NRZ binary digital signal for communication at a data rate from a sending device to a receiving device, each bit of said signal being present for an interval termed a "bit cell" and the beginning of each bit cell being termed its leading edge, comprising:

(a) means (102, 106, 108, 100, 112) for generating a first type of pulse at the leading edge of the $i^{th}$ bit cell responsive to the $i^{th}$ bit having a logical "1" value and for generating a second type of pulse at the leading edge of the $i^{th}$ bit having a logical "0" value;

(b) the first and second types of pulses having the same fixed, pre-determined duration such duration being no greater than half the duration of a bit cell and being independent of the data rate;

(c) means (108) for comparing the value of the $i^{th}$ bit with the value of the $(i+1)^{th}$ bit;

(d) means (104, 106) responsive to the means for comparing, for generating a second pulse during the bit cell, after the pulse at the leading edge of the cell, responsive to the $(i+1)^{th}$ bit having the same value as the $i^{th}$ bit;

(e) said second pulse being of the second type if the leading edge pulse was of the first type and being of the first type if the leading edge pulse was of the second type; and (f) means for combining said leading edge pulses and said second pulses into a unified pulse train, to provide an encoded signal.

9. The apparatus of claim 8 wherein the first type of pulse is a constant amplitude pulse of a first electrical polarity and the second type of pulse is a constant amplitude pulse whose amplitude is equal in magnitude but opposite in polarity, whereby the encoded signal produced thereby has a constant average value, facilitating the a.c. coupling of such signal between a sending device and a receiving device.

10. Apparatus for decoding a signal representing an encoded binary digital data signal and a clocking signal therefor, to provide a decoded NRZ signal corresponding to said binary data signal, wherein for each bit of the binary data signal there is a corresponding interval termed a "bit cell", the beginning of each bit cell being termed its "leading edge", and the encoded signal includes, for each bit cell; a first pulse at the leading edge of the bit cell indicating the value of the data bit associated therewith and, when the bit value of the data bit in the next succeeding bit cell is the same as the bit value for said cell, a second pulse opposite in polarity relative to said first pulse, said decoding apparatus including means for discriminating between said first pulses and said second pulses; and means (200) responsive to said means for discriminating, for determining the value of each of said first pulses and for holding each of said determined values between successive ones of said first pulses, the held values being the decoded NRZ signal; said means for discriminating including a delay of a duration which is fixed and independent of the rate at which the data bits occur.

11. Apparatus for decoding a digital signal to provide a decoded NRZ signal, the encoded signal being a stream of relatively positive and relatively negative pulses of predetermined, fixed duration, the stream including data pulses and compensation pulses, the decoding apparatus comprising:

(a) means for detecting said negative pulses;

(b) means for detecting said positive pulses;

(c) means responsive to the negative and positive pulse detecting means for setting a bilevel signal to a first binary level at the leading edge of a negative pulse and for setting said bilevel signal to a second binary level at the leading edge of a positive pulse; and (d) means for sampling said bilevel signal at a predetermined time after the leading edge of a pulse, such predetermined time being fixed and independent of the rate at which the data pulses occur in the stream and for holding the sampled values thereof between the taking of samples, such that the sampled values constitute the decoded NRZ signal.

12. Apparatus for decoding a digital signal which has been encoded into a stream of relatively positive and relatively negative pulses of predetermined, fixed duration, to provide a decoded NRZ signal comprising:
(a) means 206 for detecting said negative pulses;
(b) means 204 for detecting said positive pulses;
(c) flip-flop means 210 responsive to the negative and positive pulse detecting means for setting a bistable signal to a first binary level at the leading edge of a negative pulse and for setting said bistable signal to a second binary level at the leading edge of a positive pulse;
(d) means 222 for storing a sample of the bistable signal from one sample time to a next sample time, responsive to a clocking signal, said stored bistable signal comprising the logical complement of the decoded NRZ signal;
(e) means for generating a clocking signal, comprising
(1) an exclusive-OR gate 218 receiving as a first input the bistable signal and as a second input the stored bistable signal;
(2) delay means 222 connecting the output of the exclusive-OR gate to the means for storing a sample of the bistable signal for providing, as a clocking signal, the output of the exclusive-OR gate delayed by an interval equal to the predetermined pulse duration.

13. The apparatus of claim 12 further including means responsive to the positive and negative pulse detecting means for sensing the occurrence of two successive pulses of the same polarity without an intervening pulse of opposite polarity.

14. The apparatus of claim 8 wherein the first type of pulse comprises an optical signal (264) differing in amplitude in a first direction from an average level (262) and the second type of pulse comprises an optical signal (266) differing in amplitude in the opposite direction from the average level (262).

* * * * *